(12) United States Patent
Nguyen et al.

(10) Patent No.: US 11,675,655 B1
(45) Date of Patent: *Jun. 13, 2023

(54) SOLID-STATE DRIVE ERROR RECOVERY BASED ON MACHINE LEARNING

(71) Applicant: Marvell Asia Pte, Ltd., Singapore (SG)

(72) Inventors: Phong Sy Nguyen, Livermore, CA (US); Dung Viet Nguyen, San Jose, CA (US); Christophe Therene, Livermore, CA (US); Nedeljko Varnica, San Jose, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 17/691,849

(22) Filed: Mar. 10, 2022

Related U.S. Application Data

(63) Continuation of application No. 16/815,753, filed on Mar. 11, 2020, now Pat. No. 11,275,646.

(60) Provisional application No. 62/816,759, filed on Mar. 11, 2019.

(51) Int. Cl.
| | |
|---|---|
| *G06F 11/00* | (2006.01) |
| *G06F 11/07* | (2006.01) |
| *G06F 11/22* | (2006.01) |
| *G06N 20/00* | (2019.01) |
| *G06F 11/34* | (2006.01) |

(52) U.S. Cl.
CPC ...... *G06F 11/0793* (2013.01); *G06F 11/0727* (2013.01); *G06F 11/2215* (2013.01); *G06F 11/3452* (2013.01); *G06N 20/00* (2019.01)

(58) Field of Classification Search
CPC .......... G06F 11/14; G06F 11/30; G06F 11/34; G06F 11/3466; G06F 11/3476
See application file for complete search history.

(56) References Cited

U.S. PATENT DOCUMENTS

| | | | |
|---|---|---|---|
| 9,069,737 B1 | 6/2015 | Kimotho et al. | |
| 11,500,570 B2 * | 11/2022 | Bernat | .................... G06F 12/06 |
| 2015/0381206 A1 * | 12/2015 | Fainzilber | .......... H03M 13/1111 |
| | | | 714/758 |
| 2017/0148102 A1 | 5/2017 | Franke et al. | |
| 2018/0341580 A1 | 11/2018 | Miao | |
| 2019/0043589 A1 * | 2/2019 | Kwok | ................ G11C 16/0483 |
| 2019/0320519 A1 | 10/2019 | Kim et al. | |
| 2020/0081648 A1 | 3/2020 | Bernat et al. | |
| 2020/0151060 A1 | 5/2020 | Rinaldi et al. | |

(Continued)

*Primary Examiner* — Joshua P Lottich

(57) ABSTRACT

Systems and methods for selecting an optimal error recovery procedure for correcting a read error in a solid-state drive are provided. A machine learning model is trained to forecast which error recovery procedure of a plurality of error recovery procedures is most likely to achieve a predetermined goal given a state of a solid-state drive. The predetermined goal is based on at least one of a read latency and a failure rate of the solid-state drive. A current state of the solid-state drive is determined. An error recovery procedure is selected from among the plurality of error recovery procedures by inputting the current state of the solid-state drive into the trained machine learning model, thereby triggering the trained machine learning model to output the selected error recovery procedure. The selected error recovery procedure is executed to recover data from the solid-state drive.

20 Claims, 3 Drawing Sheets

(56) References Cited

U.S. PATENT DOCUMENTS

2020/0151065 A1    5/2020   Rinaldi et al.
2020/0371858 A1   11/2020   Hayakawa

* cited by examiner

SOLID-STATE DRIVE ERROR RECOVERY BASED ON MACHINE LEARNING

CROSS-REFERENCE TO RELATED APPLICATION

This application is a continuation application of U.S. patent application Ser. No. 16/815,753, filed Mar. 11, 2020, which claims the benefit under 35 U.S.C. § 119(e) of U.S. Provisional Patent Application No. 62/816,759, filed Mar. 11, 2019, each of which is hereby incorporated by reference herein in its entirety.

FIELD OF USE

This disclosure relates to solid-state drive technology, and specifically, to systems and methods for selecting an optimal error recovery procedure for correcting a read error in a solid-state drive.

BACKGROUND OF THE DISCLOSURE

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

Data written onto NAND flash memory of solid-state drives (SSDs) is subject to different types of noise emanating from different sources, such as a Program/Erase (PE) cycle, retention, and read disturb to name a few. To preserve the integrity of data on NAND drives, some form of error correction coding (ECC), such as low-density parity check (LDPC) coding, is employed by an SSD controller. Each read operation on the NAND produces hard-decision data which is decoded by an error correction unit (ECU) in the SSD controller and sent to the host. If the decoder in the ECU is unable to recover the data unit, an uncorrectable ECC (UECC) event is said to have occurred.

Error recovery flow (ERF) is the generic name given to the process of recovering from such a UECC event. An ERF may involve in using different decoders in the ECU with different characteristics. This may involve reading from the NAND multiple times which, on the positive side, may result in improved data being provided to decoder/decoders however, on the negative side, results in an added latency and temporary blocking of the shared NAND resource. There are several types of ERFs, with some being more suitable in particular cases than others, because of respective latency issues as well as different failure rates.

SUMMARY

Embodiments described herein provide systems and methods for selecting an optimal error recovery procedure for correcting a read error in a solid-state drive. In one example, a method includes training a machine learning model to forecast which error recovery procedure among a plurality of error recovery procedures is most likely to achieve a predetermined error recovery goal for a given state of a solid-state drive. The predetermined goal is based on at least one of a read latency and a failure rate of the solid-state drive. In some implementations, the predetermined goal is based on a combination of the read latency and the failure rate of the solid-state drive. A current state of the solid-state drive is determined by reading state data from the solid-state drive. An error recovery procedure is selected from among the plurality of error recovery procedures by inputting the current state of the solid-state drive into the trained machine learning model, thereby triggering the trained machine learning model to output the selected error recovery procedure. The selected error recovery procedure is executed to recover data from the solid-state drive.

In one example, training the machine learning model comprises observing a state of the solid-state drive, executing one of the plurality of error recovery procedures to recover data from the solid-state drive, determining a result indicating whether the executed error recovery procedure successfully recovered the data from the solid-state drive and indicating a latency of the executing of the error recovery procedure, generating a reward based on the determined result and a predetermined rule indicating a magnitude to be allocated to the reward based on the latency of the executing of the error recovery procedure, and applying the reward to the machine learning model.

In another example, the determining the result of the executed error recovery procedure comprises determining a latency of successfully recovering data from the solid-state drive, and the predetermined rule comprises a rule that dictates a magnitude of the reward that is inversely proportional to the latency.

In another aspect, determining the latency of successfully recovering data from the solid-state drive comprises determining a sum of respective latencies of one or more error recovery procedures that are executed to successfully recover the data from the solid-state drive.

Determining the result of the executed error recovery procedure, in some examples, comprises determining a failure rate of the solid-state drive, with the predetermined rule comprising a rule that dictates a magnitude of the reward that is inversely proportional to the failure rate.

Determining the current state of the solid-state drive, in a further aspect, comprises determining at least one of allocation unit (AU)-based decoder statistics, media statistics, media health statistics, and a temperature.

Examples of the plurality of error recovery procedures include a one-bit read retry, a two-bit read retry, a k-read deep retry, a voltage reference calibration, a log likelihood ratio calibration, an inter-cell interference cancellation, a hard error mitigation, and/or a redundant array of independent disks-based procedure.

Selecting the error recovery procedure in some aspects further comprises selecting an error recovery procedure parameter, such as one or more voltage reference numbers, and the executing the selected error recovery procedure comprises executing the selected error recovery procedure based on the selected error recovery procedure parameter.

The method, in some examples, further comprises retraining the machine learning model based on at least one of a success and a failure of recovering data from the solid-state drive by executing the selected error recovery procedure.

In accordance with another implementation, a system for selecting an optimal error recovery procedure for correcting a read error in a solid-state drive includes a machine learning agent that comprises a machine learning model, such as a neural network, and is communicatively coupled to a solid-state drive. The machine learning agent is configured to train the machine learning model to forecast which error recovery procedure among a plurality of error recovery procedures is most likely to achieve a predetermined error recovery goal for a given state of the solid-state drive, wherein the predetermined goal is based on at least one of a read latency and a failure rate of the solid-state drive. The machine learning agent determines a current state of the solid-state drive by reading state data from the solid-state drive, and selects an error recovery procedure from among the plurality of error recovery procedures by inputting the current state of the solid-state drive into the trained machine learning model, thereby triggering the trained machine learning model to output the selected error recovery procedure. The machine learning agent then causes the solid-state drive to execute the selected error recovery procedure to recover data therefrom.

In some examples, the machine learning agent is configured to train the machine learning model by observing a state of the solid-state drive; executing one of the plurality of error recovery procedures to recover data from the solid-state drive; determining a result indicating whether the executed error recovery procedure successfully recovered the data from the solid-state drive and indicating a latency of the executing of the error recovery procedure; generating a reward based on the determined result and a predetermined rule indicating a magnitude to be allocated to the reward based on the latency of the executing of the error recovery procedure; and applying the reward to the machine learning model.

The machine learning agent, in other examples, is configured to determine the result of the executed error recovery procedure by determining a latency of successfully recovering data from the solid-state drive, with the predetermined rule comprising a rule that dictates a magnitude of the reward that is inversely proportional to the latency.

The machine learning agent, in a further aspect, may be configured to determine the latency of successfully recovering data from the solid-state drive by determining a sum of respective latencies of one or more error recovery procedures that are executed to successfully recover the data from the solid-state drive.

In yet a further aspect, the machine learning agent may be configured to determine the result of the executed error recovery procedure by determining a failure rate of the solid-state drive, and wherein the predetermined rule comprises a rule that dictates a magnitude of the reward that is inversely proportional to the failure rate.

The machine learning agent, in some aspects, may be configured to determine the current state of the solid-state drive by determining at least one of AU-based decoder statistics, media statistics, media health statistics, and a temperature.

The plurality of error recovery procedures may comprise at least one of a one-bit read retry, a two-bit read retry, a k-read deep retry, a voltage reference calibration, a log likelihood ratio calibration, an inter-cell interference cancellation, a hard error mitigation, and a redundant array of independent disks-based procedure.

The machine learning agent, in a further example, may be configured to select the error recovery procedure by selecting one or more error recovery procedure parameters, such as one or more voltage reference numbers; and execute the selected error recovery procedure by executing the selected error recovery procedure based on the selected one or more error recovery procedure parameters.

In another aspect, the machine learning agent is further configured to re-train the machine learning model based on at least one of a success and a failure of recovering data from the solid-state drive by executing the selected error recovery procedure.

BRIEF DESCRIPTION OF THE DRAWINGS

Further features of the disclosure, its nature and various potential advantages will become apparent upon consideration of the following detailed description, taken in conjunction with the accompanying drawings, in which like reference characters refer to like parts throughout, and in which.

DETAILED DESCRIPTION

Figure 1:
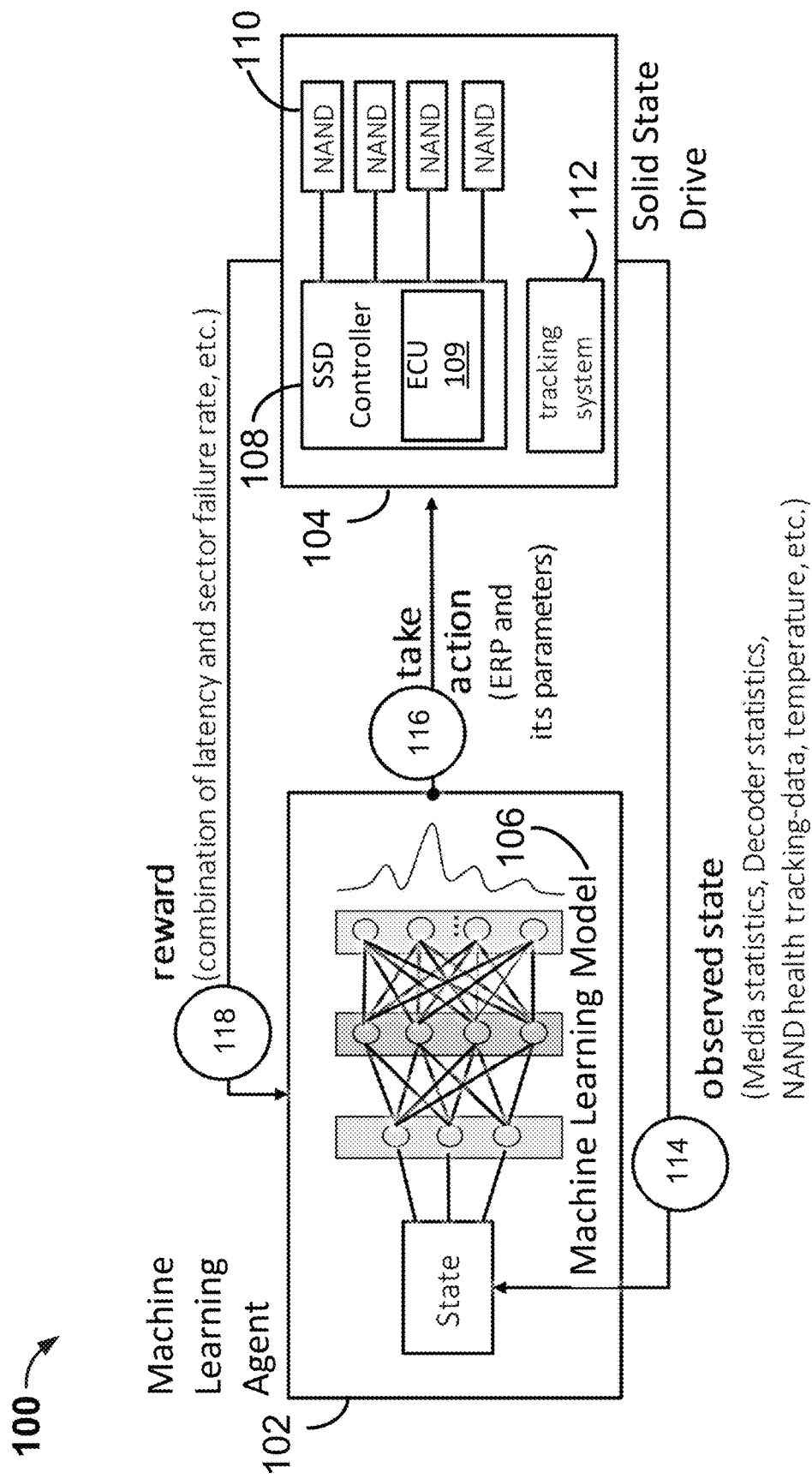
FIG. 1 is a block diagram of a system for selecting an optimal error recovery procedure for correcting a read error in a solid-state drive, in accordance with an embodiment of the present disclosure.

In accordance with implementations of the present disclosure, methods and systems for selecting an optimal error recovery procedure for correcting a read error in an SSD are disclosed. The methods and systems herein carry out artificial intelligence (AI) operations, such as those involving machine learning and/or neural networks, to select an optimal error recovery procedure. Specifically, in one implementation, disclosed is a machine learning agent, which is coupled to the SSD and has a machine learning model, such as a neural network, that is trained, by utilizing machine learning techniques involving a training dataset, to adaptively select an optimal error recovery procedure for correcting a read error in the SSD, based on a current state of the SSD. In particular, the machine learning agent is configured to observe a state of the SSD, attempt to recover data from the SSD by executing one of multiple error recovery procedures, and based on the result of the procedure, feed a reward back to the machine learning model (for instance, as part of a reinforcement learning (RL) algorithm) to train the machine learning model on the relative success of executing that particular error recovery procedure given the measured state of the SSD. The machine learning agent can take advantage of AU-level statistics along with other inputs, such as NAND health, temperature, and/or the like, which may be constituent components of the state of the SSD, to take an action, such as executing a particular error recovery procedure and/or configure its associated parameters, adaptively.

In various implementations, the reward may be generated based on a measured latency, failure rate of at least one or more portions (for instance, sectors) of one or more SSDs, and/or any combination of the two, depending upon the behavior desired from the SSD-based system. The system thus has the ability to "fast forward" recovery to an effective error recovery procedure and/or associated parameters by using a machine learning or reinforcement learning model by which the machine learning model learns the best action to take based on a given state of the SSD or portion thereof. This is especially desirable in latency-sensitive applications such as a data center or cloud storage. The system can also learn optimal parameters to run with error recovery procedures through the reinforcement learning training process, and hence can improve a sector failure rate performance of the SSD. These improvements in latency and/or failure rate performance of an SSD are particularly useful in extending the useful lifetime of an SSD. Additionally, owing to the vast number of statistics to track as part of the states of the SSD 104 or portions thereof, it is unfeasible and/or impractical to maintain statistics for sub-sequent usage in determining which error recovery procedure to select as optimal for a give state, as indicated by the current values of statistics or inputs. For instance, tracking such statistics at a NAND block or page level is insufficient since AUs within a block/page might have different states and behavior, and there are too many 4K AUs to feasibly and practically track within the SSD. By training a machine learning model to select the optimal error recovery procedure for a given SSD state, the machine learning agent solution can be scaled upward without requiring vast amounts of storage space to store historical SSD statistics accumulated over time to serve as a reference for selecting an error recovery procedure.

FIG. 1 is a block diagram illustrating a system 100 for selecting an optimal error recovery procedure for correcting a read error in an SSD, according to some embodiments described herein. The system 100 includes a machine learning agent 102 and an SSD 104, which are communicatively coupled to one another and/or integrated within a common housing. The machine learning agent 102, which can be implemented in hardware or firmware, includes a machine learning model 106, such as a neural network or any other suitable type of machine learning model. The SSD 104 includes an SSD controller 108, coupled to multiple NAND flash storages 110, and tracking system 112.

The SSD 104 may have multiple channels, and each channel can have multiple NAND storages 110 or dies, each sometimes referred to as a logical unit on NAND (LUN). Each NAND storage 110 has many blocks, and each block has many pages. Data may be read from the NAND 110 on a page-level, which has a typical page size of 16 KB, or even on a partial-page-level. To read data from NAND 110, the SSD controller 108 specifies a voltage reference (VREF) to be used to resolve whether a stored voltage represents a logical high (e.g., one) or a logical low (e.g., zero). The SSD controller 108 includes an ECU 109, which processes data on an AU level. In one example, the AU size is 4 KB each page includes 4 AUs. Error recovery is performed on the AU level and there can be one or multiple ECC codewords per AU, in various implementations.

The SSD controller 108 may employ different ECC decoders which in turn can operate in different modes. Each of the decoding modes may be associated with different sector failure rate (SFR) performance and decoding latency. For example, the table below shows two decoders, which can operate in several modes.

TABLE 1

| Decoder Mode | SFR Performance | NAND Read Latency | Decoding Latency |
|---|---|---|---|
| Hard-input Fast Decoder | Weaker | Low | Low |
| Hard-input Slow Decoder | Medium | Low | High |
| 2-bit Input Fast Decoder | Stronger | High | Low |
| Soft-input Slow Decoder | Strongest | High/Very High | High |

As Table 1 illustrates, aiming for a lower latency may result in a weaker SFR performance.

The machine learning agent 102 may select to execute an ERP from among multiple ERPs, each of which may itself contain multiple operations, use different decoder modes, and be run multiple times with different sets of parameters. Each ERP may be suitable for a particular failure mechanism. UECC can be due to program/erase (PE) cycling, read disturb, retention stress, inter-cell interference, stuck cells, bad bit-lines, sub-optimal VREF, die failure, and/or other causes. Table 2 below summarizes examples of various ERPs along with the conditions under which the ERP may be useful.

TABLE 2

| ERP | How ERP Works | When ERP may be Useful |
|---|---|---|
| Read Retry | Retrying hard input decoding by performing a read with a new VREF. In some scenarios, NAND vendors can be provided a recommended read retry VREF table. | Useful when sub-optimal VREF were used for original read. Since hard decision data is used, the performance is not sensitive to quality of soft information. |
| Two-Bit Retry | Perform NAND reads with associated VREFs to get 2-bit input where one bit represents hard input and other bit represents reliability; and run with a decoder | Useful when hard decision read is close to optimal and soft information quality is good. |
| K-Read Deep Retry | Running a decoder using soft information collected from multiple reads, each read with a change VREF. | Useful to recover pages with very bad SNR. Has higher latency but very good performance. |
| VREF Calibration | Inferring optimal VREFs using histogram collection though issuing many NAND reads. | Useful when sub-optimal VREFs are reason for failure and optimal settings could not be found easily. |
| LLR Calibration | Adjusting LLRs assignment to bins based on collected histogram. | Useful when soft information is collected with sub-optimal VREFs and LLRs were assigned assuming that the VREFs were optimal. |
| Inter-Cell Interference Cancellation | Cancelling the interference caused by adjacent cells by assigning LLRs based on states of adjacent cells. This involves many reads to track the states of adjacent cells. | Useful to recover pages with very bad SNR. |
| Hard Error Mitigation | Adjusting LLRs taking hard errors into account, detecting bad cells and bad bit-lines. | Useful to recover pages with disproportionate number of hard errors. |
| RAID | Recovering one failed AU in a RAID stripe by XOR-ing the remaining successful AUs in the stripe. | Useful to recover from die failures. Can be used to recover from other failure mechanisms also. |

One ERF approach involves running a predetermined sequence of ERPs until a failed AU is recovered. Going through ERPs one-by-one, however, incurs a long latency before data is recovered. Moreover, conventionally ERP parameters are hard-coded fixed parameters, which does not yield the best error recovery capability. The machine learning agent 102 described herein overcomes these technical challenges and provides for improved error recovery capability that achieves lower latency and/or reduced failure rates.

The machine learning agent 102, in some implementations, can be a Deep Q Network, a Policy Gradient, an Actor-Critic, a Proximal Policy Optimization (PPO), and/or any variations thereof. In some embodiments, weights of the machine learning agent 102 are configurable. Their default values are trained off-line using data from a NAND characterization platform provided by various NAND vendors, under various conditions of NAND health (such as P/E cycle, read disturb, retention, or the like) and temperature.

In some embodiments where only inference is needed, the machine learning agent 102 can observe the state of the SSD 104 as the input in order to output an action without utilizing the reward feedback from the SSD 104.

In some embodiment, depending on applications, the weights of the machine learning agent 102 can be partially or fully re-trained based on taking episodes of actions interacting with environment and obtaining an immediate reward from the environment.

In various implementations, the machine learning agent is configured to observe a state (114) of the SSD 104, take an action (116), such as performing an error recovery procedure on the SSD 104, and then apply a reward (118) to the machine learning model 106 based on a result of the action (116) and the state (114) of the SSD 104.

In one embodiment, the machine learning agent 102 is trained off-line, such as at a manufacturer facility before being provided for installation at a customer facility, using data from a NAND characterization platform from various NAND vendors, under various conditions of NAND health, including one or more of P/E cycle, read disturb, retention, and temperature. During and after training, the machine learning agent 102 observes the state of the SSD 104 and outputs the recommended action based on the observed state. In some embodiments, the machine learning agent 102 is optionally periodically re-trained during on-line operation in a manner similar to that described above for the initial training operation.

In one embodiment shown in FIG. 1, the SSD controller 108 may be implemented as a system-on-chip (SoC) that reads data from the NAND storage 110, performs error correction, and can provide the machine learning agent 102 with AU-based information, such as media statistics and decoder statistics. The tracking system 112, in some implementations, provides the SSD controller 108 and/or the machine learning agent 102 with information on health, temperature, and/or the like of the NAND storages 110.

The state of the SSD 104 that the machine learning agent may observe (114) may include any suitable metric indicative of the state of the SSD 104 or any portion thereof. For instance, in various implementations, the state of the SSD 104 or a portion thereof can be defined from any one or any combination of, without limitation: AU-based decoder statistics (e.g., number of zero-to-one and one-to-zero corrections, number of iterations, initial/final syndrome weight, and/or the like for each codeword in an AU); media statistics (e.g., number of zeros and number of ones in raw data, maximum run of zeros, maximum run of ones, voltage reference (VREF) settings used, and/or the like); media health statistics or data (e.g., program/erase (PE) cycles, read disturb counts, retention information, and/or the like); temperature, and/or the like. In some embodiments, the state of the SSD 104 can be obtained after preprocessing of the above raw information. For example, the machine learning agent 102 can take a ratio of a number of zeros over a number of ones and subtract by some amount. In some aspects, the state of the SSD 104 can be defined as a concatenation of the above information (or a subset thereof) within some window of previous actions.

The action (116) that the machine learning agent may take may be to perform an error recovery procedure with associated parameters. For example, the action (116) can be to perform a read retry with a particular VREF entry number obtained from a read retry table provided by the manufacturer of the NAND(s) 110. Alternatively, the action (116) could be to perform a read retry with some other VREF value, perform a two-bit retry with a set of VREFs and a decoding rule, perform a deep retry with a set of VREFs and LLR lookup table (LUT), and/or the like. In some implementations, the machine learning agent 102 is only configured to perform a subset of possible error recovery procedure actions. For example, in a scenario where an error recovery flow only permits read retry from a table provided by the vendor of the NAND(s) 110, the only action the machine learning agent 102 is permitted to take is to perform a read retry with a VREF entry number obtained from this table.

The reward (118) that the machine learning agent 102 may obtain from the SSD 104 can, in various implementations, be a function of latency and/or sector failure rate with adjustable contributing factors, with the lower the latency and/or the lower the sector failure rate resulting in a larger reward. In some embodiments where the application is latency critical, the reward definition may be based solely on latency. In other embodiments where the application is endurance critical, the reward may be based solely on a sector failure rate.

Figure 2:
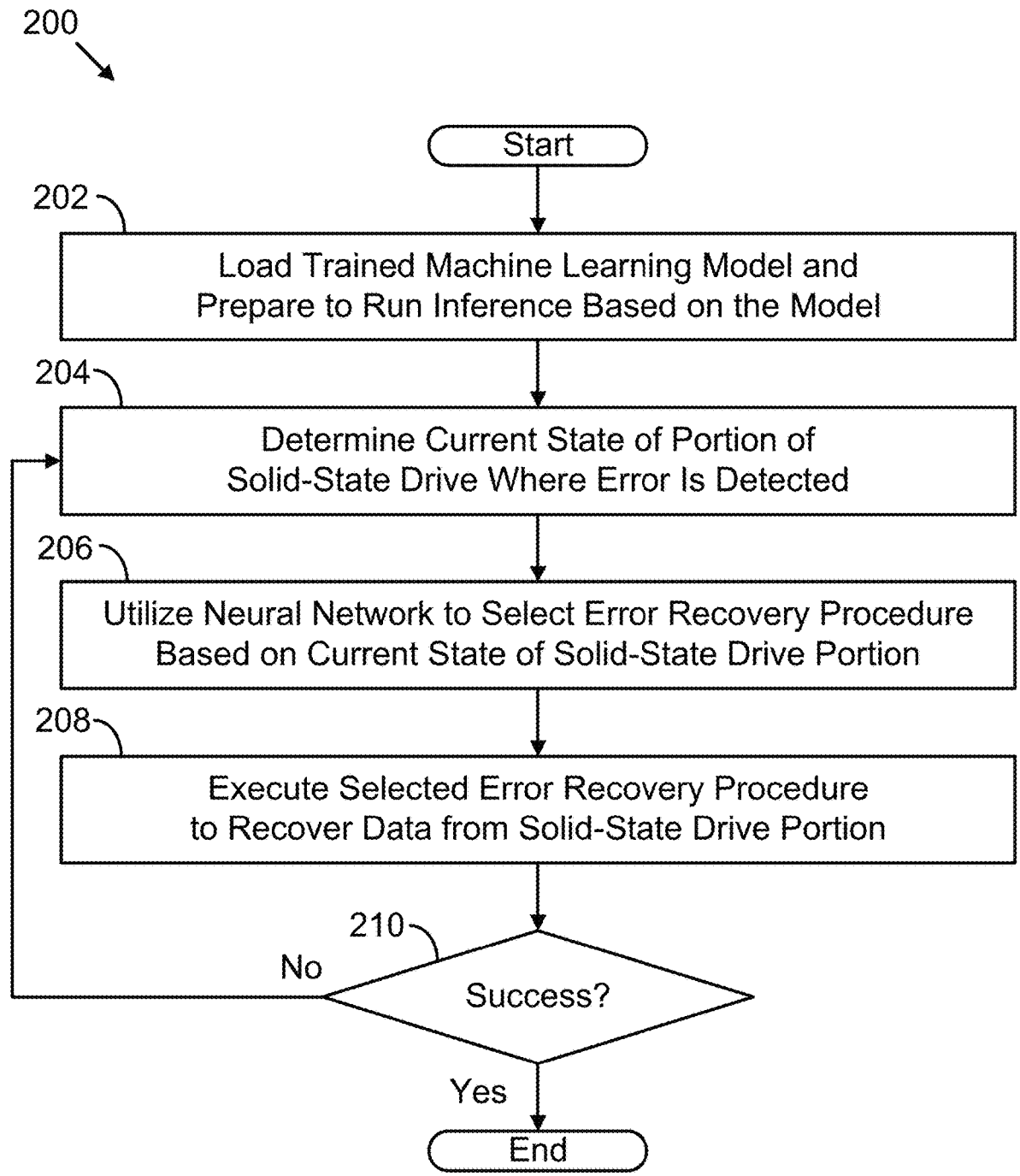
FIG. 2 is a high-level flow chart for a process for utilizing the system of FIG. 1 to select an optimal error recovery procedure for correcting a read error in a solid-state drive, in accordance with an embodiment of the present disclosure.

FIG. 2 provides an example logic flow diagram of a method 200 for selecting an optimal error recovery procedure for correcting a read error in a solid-state drive, which may be implemented by the machine learning agent 102 of FIG. 1 in accordance with some embodiments described herein. The method 200 begins at 202. Prior to 202, the machine learning model 106 is trained, off-line in some implementations, to forecast which error recovery procedure, from among multiple possible error recovery procedures (e.g., the error recovery procedures described above), and/or which associated error recovery procedure parameter(s) (e.g., one or more voltage reference numbers(s)), would be most likely to achieve one or more predetermined goals, given a state of a solid-state drive. As described above, the one or more predetermined goals may be based on a latency, a failure rate of the solid-state drive, and/or the like. An example procedure 300 for training the machine learning model 106 is described in further detail below in connection with FIG. 3. At 202, the machine learning agent 102 loads the trained machine learning model 106 and prepares to run inference based on the trained model. In some embodiments, such an inference step could also be used as a step toward on-line re-training.

At 204, the machine learning agent 102, in response to detecting an error at a portion (e.g., an AU, a page, or any other portion) of the SSD 104, determines a current state of the portion of the SSD 104 where the error was detected. The state of the SSD 104 or portion thereof generally includes values of one or more respective variables that, through the training of the machine learning model, have been shown to be useful in determining which error correction procedure among possible error correction procedures is most likely to be best suited for correcting the detected error while achieving an error correction goal, such as decreased latency and/or decreased failure rate. As described above, determining the current state of the SSD 104 or portion thereof may include reading from the SSD 104, state data such as allocation unit-based decoder statistics (e.g., number of zero-to-one and one-to-zero corrections, number of iterations, initial/final syndrome weight, and/or the like for each codeword in an AU), media statistics (e.g., number of zeros and number of ones in raw data, maximum run of zeros, maximum run of ones, voltage reference (VREF) settings used, and/or the like), media health statistics (e.g., PE cycles, read disturb count, retention information, and/or the like), a temperature, and/or the like.

At 206, the machine learning agent 102 selects an error recovery procedure from among the possible error recovery procedures by inputting the current state of the SSD 104 or portion thereof into the trained machine learning model 106, thereby triggering the trained machine learning model 106 to output the selected error recovery procedure based on its training.

At 208, the machine learning agent 102 executes the error recovery procedure that was selected at 206, utilizing any associated error recovery procedure parameters that may have been selected, to recover data from the SSD 104 or portion thereof where the error was detected.

At 210, the machine learning agent 102 determines whether the error recovery procedure that was executed at 208 was successful. If so ("Yes" at 210), then the process 200 terminates. Otherwise ("No" at 210), then control passes back to 204 to repeat the process described above in an effort to recover the data from the SSD 104.

Figure 3:
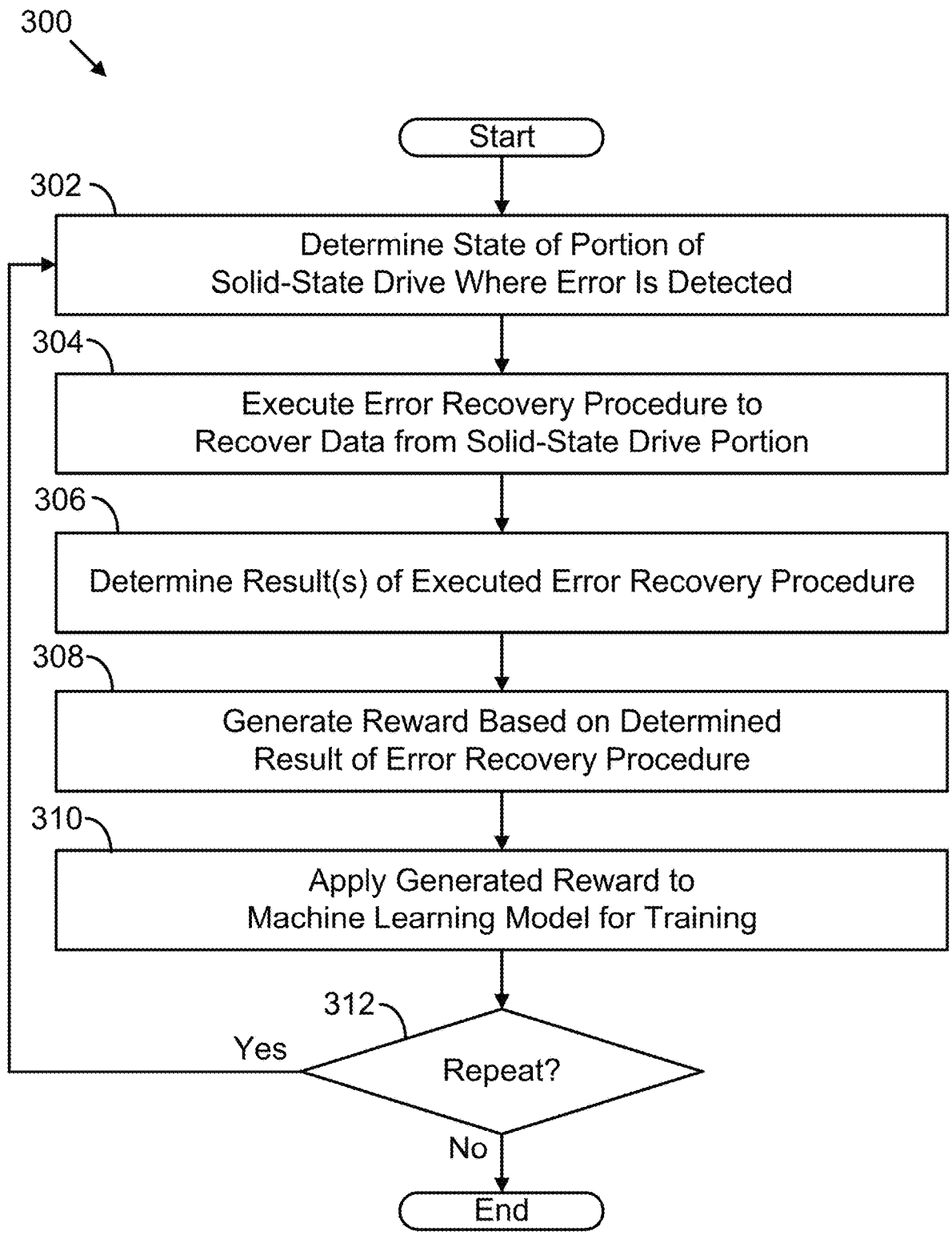
FIG. 3 is a high-level flow chart for a process for utilizing the system of FIG. 1 to train a machine learning model to select an optimal error recovery procedure for correcting a read error in a solid-state drive, in accordance with an embodiment of the present disclosure.

FIG. 3 is a high-level flow chart for a method 300 for training a machine learning model to select an optimal error recovery procedure for correcting a read error in a solid-state drive, in accordance with an embodiment of the present disclosure. The method 300 begins at 302. At 302, in response to detecting an error at a portion (e.g., an AU, a page, or any other portion) of the SSD 104, determines, the machine learning agent 102 determines a current state of the portion of the SSD 104 where the error was detected, in the manner described above.

At 304, the machine learning agent 102 executes an error recovery procedure (e.g., a default error recovery procedure, an error recovery procedure selected according to a stepwise process, or the like,) to recover data from the SSD 104.

At 306, the machine learning agent 102 determines a result of the error recovery procedure that was executed at 304. Determining the result of the executed error recovery procedure, in some examples, may include determining a latency of successfully recovering data from the SSD 104, which itself may include determining a sum of respective latencies of one or more error recovery procedures executed to successfully recover the data from the solid-state drive. In another example, determining the result of the executed error recovery procedure may include determining a failure rate of the solid-state drive.

At 308, the machine learning agent 102 generates a reward based on the result of the error recovery procedure determined at 306 and a predetermined rule. The predetermined rule, for example, may indicate a magnitude to be allocated to the reward based on the latency of the executing of the error recovery procedure. In another example, the predetermined rule may include a rule that dictates a magnitude of the reward that is inversely proportional to the latency, and/or a rule that dictates a magnitude of the reward that is inversely proportional to the failure rate.

At 310, the machine learning agent 102 applies the reward, which was generated at 308, to the machine learning model 106 to train the machine learning model 106 to select an optimal error recovery procedure based on one or more predetermined goals and taking into account the state of the SSD 104.

In some embodiments, the process 300 is implemented once per SSD 104 during an off-line manufacturing or calibration process. In other embodiments, the process 300 is implemented continuously and/or periodically, while the SSD 104 is in an online operation, in order to re-train the machine learning model 106 based on at least one of a success and a failure of recovering data from the SSD 104 by executing the selected error recovery procedure.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure without departing from the scope of the claims.

While operations are depicted in the drawings in a particular order, this is not to be construed as requiring that such operations be performed in the particular order shown or in sequential order, or that all illustrated operations be performed to achieve the desirable results.

What is claimed is:

1. A method for selecting an optimal error recovery procedure for correcting a read error in a solid-state drive, the method comprising:
    training a machine learning model to forecast which error recovery procedure among a plurality of error recovery procedures is most likely to achieve a predetermined error recovery goal for a given state of a solid-state drive, wherein the predetermined goal is based on a combination of a read latency and a failure rate of the solid-state drive;
    determining a current state of the solid-state drive by reading state data from the solid-state drive, wherein determining the current state of the solid-state drive comprises determining at least one of an allocation unit-based decoder statistic, a media statistic, a media health statistic, or a temperature;
    selecting an error recovery procedure from among the plurality of error recovery procedures by inputting the current state of the solid-state drive into the trained machine learning model, thereby triggering the trained machine learning model to output the selected error recovery procedure; and
    executing the selected error recovery procedure to recover data from the solid-state drive.

2. The method as claimed in claim 1, wherein determining the allocation unit-based decoder statistic comprises determining at least one of a number of zero-to-one corrections or a number of one-to-zero corrections.

3. The method as claimed in claim 1, wherein determining the allocation unit-based decoder statistic comprises determining a number of iterations.

4. The method as claimed in claim 1, wherein determining the allocation unit-based decoder statistic comprises determining an initial syndrome weight or a final syndrome weight.

5. The method as claimed in claim 1, wherein determining the media statistic comprises determining at least one of a number of zeros or a number of ones in raw data.

6. The method as claimed in claim 1, wherein determining the media statistic comprises determining at least one of a maximum run of zeros or a maximum run of ones.

7. The method as claimed in claim 1, wherein determining the media statistic comprises determining a voltage reference setting.

8. The method as claimed in claim 1, wherein determining the media health statistic comprises determining a program erase (PE) cycle.

9. The method as claimed in claim 1, wherein determining the media health statistic comprises determining a read disturb count.

10. The method as claimed in claim 1, wherein determining the media health statistic comprises determining data retention information.

11. A system for selecting an optimal error recovery procedure for correcting a read error in a solid-state drive, the system comprising:
 a machine learning agent that comprises a machine learning model and is communicatively coupled to a solid-state drive, the machine learning agent being configured to:
  train the machine learning model to forecast which error recovery procedure among a plurality of error recovery procedures is most likely to achieve a predetermined error recovery goal for a given state of the solid-state drive, wherein the predetermined goal is based on a combination of a read latency and a failure rate of the solid-state drive;
  determine a current state of the solid-state drive by reading state data from the solid-state drive, by determining at least one of an allocation unit-based decoder statistic, a media statistic, a media health statistic, or a temperature;
  select an error recovery procedure from among the plurality of error recovery procedures by inputting the current state of the solid-state drive into the trained machine learning model, thereby triggering the trained machine learning model to output the selected error recovery procedure; and
  cause the solid-state drive to execute the selected error recovery procedure to recover data from the solid-state drive.

12. The system as claimed in claim 11, wherein the machine learning agent is configured to determine the allocation unit-based decoder statistic by determining at least one of a number of zero-to-one corrections or a number of one-to-zero corrections.

13. The system as claimed in claim 11, wherein the machine learning agent is configured to determine the allocation unit-based decoder statistic by determining a number of iterations.

14. The system as claimed in claim 11, wherein the machine learning agent is configured to determine the allocation unit-based decoder statistic by determining an initial syndrome weight or a final syndrome weight.

15. The system as claimed in claim 11, wherein the machine learning agent is configured to determine the media statistic by determining at least one of a number of zeros or a number of ones in raw data.

16. The system as claimed in claim 11, wherein the machine learning agent is configured to determine the media statistic by determining at least one of a maximum run of zeros or a maximum run of ones.

17. The system as claimed in claim 11, wherein the machine learning agent is configured to determine the media statistic by determining a voltage reference setting.

18. The system as claimed in claim 11, wherein the machine learning agent is configured to determine the media health statistic by determining a program erase (PE) cycle.

19. The system as claimed in claim 11, wherein the machine learning agent is configured to determine the media health statistic by determining a read disturb count.

20. The system as claimed in claim 11, wherein the machine learning agent is configured to determine the media health statistic by determining data retention information.

* * * * *